(12) United States Patent
Murazaki

(10) Patent No.: US 10,700,242 B2
(45) Date of Patent: Jun. 30, 2020

(54) METHOD OF PRODUCING WAVELENGTH CONVERSION MEMBER

(71) Applicant: NICHIA CORPORATION, Anan-shi, Tokushima (JP)

(72) Inventor: Yoshinori Murazaki, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/854,391

(22) Filed: Dec. 26, 2017

(65) Prior Publication Data

US 2018/0182932 A1   Jun. 28, 2018

(30) Foreign Application Priority Data

Dec. 27, 2016 (JP) ................. 2016-254435
Dec. 22, 2017 (JP) ................. 2017-246739

(51) Int. Cl.
| | |
|---|---|
| *H01L 33/50* | (2010.01) |
| *C09K 11/61* | (2006.01) |
| *C09K 11/77* | (2006.01) |
| *C09K 11/02* | (2006.01) |

(52) U.S. Cl.
CPC ............ *H01L 33/501* (2013.01); *C09K 11/02* (2013.01); *C09K 11/61* (2013.01); *C09K 11/7706* (2013.01); *H01L 33/505* (2013.01); *H01L 33/507* (2013.01)

(58) Field of Classification Search
CPC ........... H01L 2924/0002; H01L 33/507; H01L 33/502; H01L 33/501; H01L 33/503; H01L 33/504; H01L 33/505; H01L 33/506; H01L 33/508; F21K 9/64

See application file for complete search history.

(56) References Cited

U.S. PATENT DOCUMENTS

| | | | | |
|---|---|---|---|---|
| 7,582,351 | B2 * | 9/2009 | Yokogawa | ............... G02B 1/10 |
| | | | | 428/212 |
| 8,450,921 | B2 * | 5/2013 | Hsieh | .................... H01L 33/501 |
| | | | | 313/498 |
| 8,698,386 | B2 * | 4/2014 | Hsieh | .................... H01L 33/501 |
| | | | | 313/498 |
| 2012/0161621 | A1 * | 6/2012 | Sato | ........................ H01L 33/54 |
| | | | | 313/512 |

(Continued)

FOREIGN PATENT DOCUMENTS

| | | |
|---|---|---|
| JP | 2012162600 A | 8/2012 |
| JP | 2013016268 A | 1/2013 |

(Continued)

*Primary Examiner* — Christopher Stanford
(74) *Attorney, Agent, or Firm* — Hunton Andrews Kurth LLP

(57) ABSTRACT

Provided is a method of producing a wavelength conversion member, comprising the steps of forming a fluorescent material layer on the top surface of a substrate and filling a translucent material into the fluorescent material layer. The fluorescent material layer contains fluorescent material particles and has voids between the fluorescent material particles. The translucent material has a lower refractive index than the fluorescent material particles and is filled into a part of the voids to form a filled region in a manner to allow the voids to be partially left unfilled with the translucent material.

19 Claims, 3 Drawing Sheets

(56) References Cited

U.S. PATENT DOCUMENTS

| | | | |
|---|---|---|---|
| 2012/0200218 A1* | 8/2012 | Maemura | H01J 29/20 313/483 |
| 2013/0003347 A1 | 1/2013 | Maemura et al. | |
| 2013/0033168 A1* | 2/2013 | Hsieh | H01L 33/501 313/498 |
| 2013/0241398 A1* | 9/2013 | Hsieh | H01L 33/501 313/503 |
| 2013/0257264 A1* | 10/2013 | Tamaki | B05D 5/06 313/503 |
| 2013/0257641 A1 | 10/2013 | Ronning | |
| 2013/0335989 A1* | 12/2013 | Sato | B60Q 1/04 362/510 |
| 2014/0071683 A1* | 3/2014 | Hamada | G03B 21/14 362/259 |
| 2014/0072812 A1* | 3/2014 | Hamada | H01S 5/02296 428/432 |
| 2014/0168942 A1* | 6/2014 | Kishimoto | F21S 43/13 362/84 |
| 2014/0268815 A1* | 9/2014 | Li | G02B 6/001 362/311.02 |
| 2015/0097166 A1* | 4/2015 | Setz | C03C 17/04 257/40 |
| 2015/0211712 A1* | 7/2015 | Yoshimura | H01S 5/005 362/84 |
| 2016/0102819 A1* | 4/2016 | Misawa | F21S 41/16 362/510 |
| 2016/0149097 A1* | 5/2016 | Saka | C23C 16/4417 257/98 |
| 2016/0233389 A1* | 8/2016 | Furuyama | H01L 33/502 |
| 2016/0365541 A1* | 12/2016 | Wehlus | C03C 14/004 |
| 2017/0167693 A1* | 6/2017 | Yamazumi | C09K 11/08 |
| 2017/0205542 A1* | 7/2017 | Lee | C03C 17/007 |
| 2017/0235216 A1* | 8/2017 | Maeda | G03B 21/204 353/84 |

FOREIGN PATENT DOCUMENTS

| | | |
|---|---|---|
| JP | 2013168408 A | 8/2013 |
| JP | 2013203822 A | 10/2013 |
| JP | 2013213131 A | 10/2013 |
| JP | 2013216800 A | 10/2013 |
| JP | 2013229438 A | 11/2013 |
| JP | 2013247067 A | 12/2013 |
| JP | 2014140046 A | 7/2014 |
| JP | 2015082643 A | 4/2015 |
| JP | 2016031402 A | 3/2016 |
| JP | 2016100485 A | 5/2016 |

\* cited by examiner

METHOD OF PRODUCING WAVELENGTH CONVERSION MEMBER

CROSS-REFERENCE TO RELATED APPLICATIONS

This application claims priority to Japanese Patent Application No. 2016-254435, filed on Dec. 27, 2016 and No. 2017-246739, filed on Dec. 22, 2017, the disclosures of which are hereby incorporated by reference in their entirety.

BACKGROUND

Technical Field

The present invention relates to a method of producing a wavelength conversion member.

Description of the Related Art

A light-emitting device known in the art may include a semiconductor light-emitting element, such as a semiconductor laser, and a wavelength conversion member containing a fluorescent material. For example, a fluorescent material wheel, which is a wavelength conversion member, for use in a projector contains a mixture of a fluorescent material and resin. See, e.g., Japanese Patent Application Publication No. 2016-031402. Such a wavelength conversion member typically has in its front an optical component, such as a lens or a diffuser panel, to control its light distribution.

SUMMARY

A method of producing a wavelength conversion member includes forming a fluorescent material layer on a top surface of a substrate and filling a translucent material into the fluorescent material layer. The fluorescent material layer contains fluorescent material particles and has voids between the fluorescent material particles. The translucent material has a lower refractive index than the fluorescent material particles and is filled into a part of the voids to form a filled region in a manner to allow the voids to be partially left unfilled with the translucent material.

DETAILED DESCRIPTION

A wavelength conversion member of the prior art may allow resin to transmit a part of incident light. This may increase the light-emitting size and decrease the light use efficiency of the optical component.

In response to this issue, one or more aspects of the present disclosure are directed to a method of producing a wavelength conversion member with improved light use efficiency.

One aspect of the present disclosure is a method of producing a wavelength conversion member. The method includes the steps of forming, on the top surface of a substrate, a fluorescent material layer that contains fluorescent material particles and has voids between the fluorescent material particles, and filling a translucent material having a lower refractive index than the fluorescent material particles into a part of the voids to form a filled region in a manner to allow the voids to be partially left unfilled with the translucent material.

The method of producing a wavelength conversion member provides a wavelength conversion member with improved light use efficiency.

Embodiments of the present disclosure will now be described with reference to drawings as appropriate. However, the embodiments described below are for embodying the concept of the present invention, and the present invention is not limited to those described below unless otherwise specified. The size, positional relationship, and others of the members may be not to scale for illustrative purposes.

Figure 1:
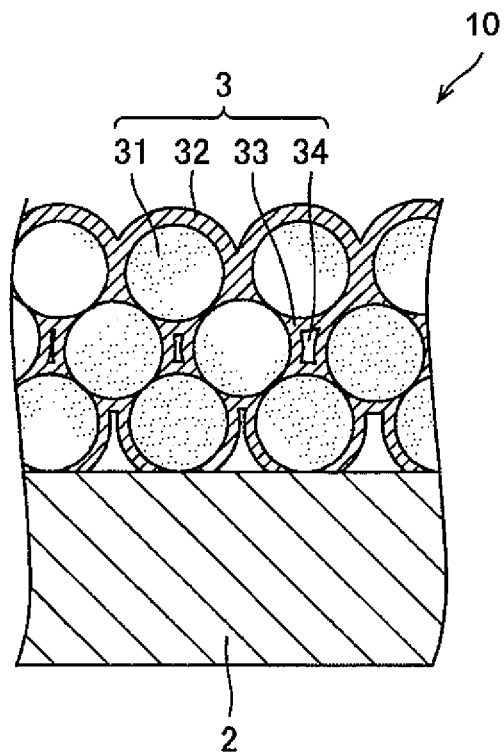
FIG. 1 is a schematic cross-sectional view of a wavelength conversion member according to an embodiment of the present disclosure.

FIG. 1 is a schematic cross-sectional view of a wavelength conversion member 10 produced by the method according to the present embodiment. The wavelength conversion member 10 includes a substrate 2, and a fluorescent material layer 3, which is formed on the top surface of the substrate 2. The fluorescent material layer 3 contains a plurality of fluorescent material particles 31. The fluorescent material layer 3 has voids 34 between the fluorescent material particles 31. Further, a translucent material 32, which has a lower refractive index than the fluorescent material particles 31, is filled in a part of the voids 34 to form a filled region 33. The term "step" as used herein encompasses not only an independent step but also a step in which the anticipated effect of this step is achieved, even if the step cannot be clearly distinguished from another step.

The wavelength conversion member 10 absorbs all or a part of incident light with the fluorescent material particles 31 in the fluorescent material layer 3, and converts the absorbed light to light having a color different from the color of the incident light.

Figure 2A:
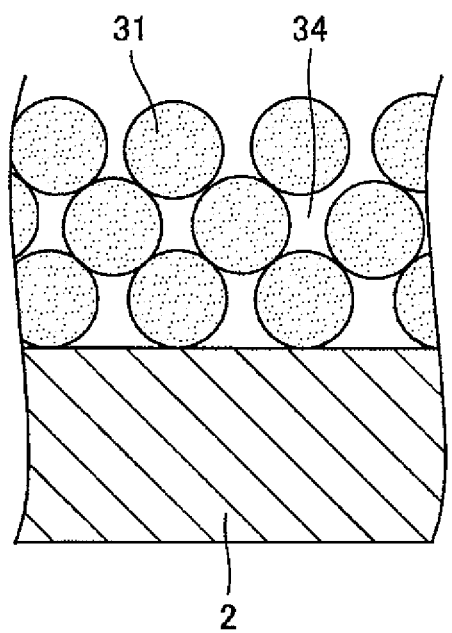
FIG. 2A is a schematic cross-sectional view of a production process of a wavelength conversion member according to an embodiment of the present disclosure.
Figure 2B:
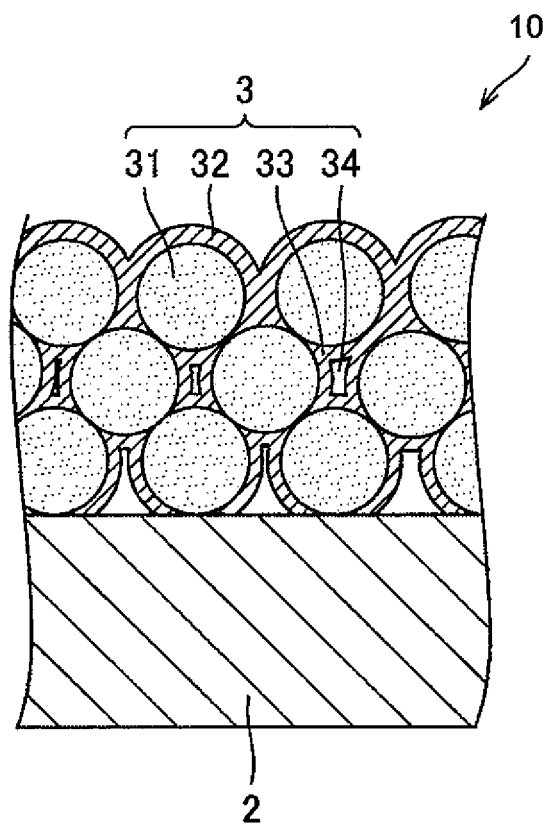
FIG. 2B is a schematic cross-sectional view of a production process of a wavelength conversion member according to an embodiment of the present disclosure.

The method of producing a wavelength conversion member 10 will now be described in detail with reference to schematic cross-sectional views of FIGS. 2A to 2B.

Step of Forming Fluorescent Material Layer 3

On the top surface of the substrate 2, the fluorescent material layer 3 containing the plurality of fluorescent material particles 31 is formed. In the step of forming the fluorescent material layer 3, a mixture of the fluorescent material particles 31 and a volatile member is applied on the top surface of the substrate 2, and then at least a part of the volatile member is allowed to volatilize to form the fluorescent material layer 3, which is an aggregate of the fluorescent material particles 31, on the top surface of the substrate 2. This step allows relatively easy formation of the fluorescent material layer 3 having the voids 34. When the wavelength conversion member 10 contains inorganic particles, such as inorganic filler particles or electrically conductive particles, the fluorescent material layer 3 is an aggregate of the fluorescent material particles 31 and the inorganic particles.

The volatile member may be any member that is volatile and can disperse the fluorescent material particles 31. The volatile member may be, for example, a member in which resin is dissolved in an organic solvent. One example of such a member may be a vehicle, and specific examples include a vehicle prepared by using ethyl cellulose (resin) and terpineol (solvent) or 2-(2-butoxyethoxy)ethanol (solvent).

The volatile member preferably further contains an inorganic binder for binding the fluorescent material particles 31 to one another, as well as the fluorescent material particles 31 to the substrate 2. Adding an inorganic binder can prevent the aggregate of the fluorescent material particles 31 from scattering until the filled region 33 is formed in the subsequent step of forming the filled region 33. Examples of the inorganic binder include an alkaline-earth metal ion, such as Mg ion, Ca ion, or Sr ion. The added alkaline-earth metal ion precipitates as a hydroxide or a carbonate, and exerts a binding force. As such hydroxide and carbonate are colorless and transparent, even if they remain in the fluorescent material layer 33 after the production of the wavelength conversion member 10, they do not affect the color conversion efficiency of the wavelength conversion member 10. Also, as they are inorganic substances, they do not affect the color conversion efficiency of the wavelength conversion member 10 over time.

Step of Forming Filled Region 33

The translucent material 32, which has a lower refractive index than the fluorescent material particles 31, is then filled into a part of the voids 34 to form the filled region 33 in a manner to leave the voids partially unfilled with the translucent material 32. In the step of forming the filled region 33, the translucent material 32 is applied on the surface of the fluorescent material layer 3, and then cured.

The fluorescent material layer 3 impregnated with the translucent material 32 has a complex layer structure including the fluorescent material particles 31 and the translucent material 32. Adjusting the amount of application of the translucent material 32 in a manner not to completely fill the voids 34 with the translucent material 32 allows a thin film of the translucent material 32 to be formed on the surfaces of the fluorescent material particles 31. This can reduce the amount of incident light that is transmitted through the translucent material 32 in the fluorescent material layer 3, and thus can prevent the light-emitting size from being excessively increased, while reducing total reflection of light on the surface of the fluorescent material layer 3. This enables efficient extraction of light to the outside. Light-emitting size as used herein refers to a range covering the size equal to or greater than $1/e^2$ of the peak intensity in the light intensity distribution of a wavelength conversion member. The translucent material 32 may be applied, for example, by spraying with a spray, potting, inkjet-printing, or printing.

Forming the filled region 33 in a manner as described above allows the fluorescent material layer 3 to have a higher void ratio in the region near the lower surface than in the region near the top surface. This enables more efficient extraction of light from the top surface of the fluorescent material layer 3, while reducing unnecessary transmission or distribution of light in the region near the lower surface of the fluorescent material layer 3. As used herein, the region near the lower surface and the region near the top surface of the fluorescent material layer 3 respectively refer to the lower portion (the lower side in FIG. 1) and the upper portion (the upper side in FIG. 1) with respect to a virtual straight line halving the fluorescent material layer in the thickness direction in a cross-sectional view of the wavelength conversion member.

The thus formed wavelength conversion member 10 has improved light extraction efficiency and light use efficiency.

The constituent elements of the wavelength conversion member 10 will now be described.

Substrate 2

As shown in FIG. 1, the fluorescent material layer 3 is arranged on the top surface of the substrate 2. The wavelength conversion member 10 includes the substrate 2, which is a light transmissive substrate, and allows light emitted from the semiconductor laser element to be transmitted through the substrate 2. Examples of the light transmissive substrate 2 include wheels containing, for example, alkali-free glass, borosilicate glass, quartz glass, crystal, or sapphire.

Fluorescent Material Layer 3

The fluorescent material layer 3 contains an aggregate of the fluorescent material particles 31. The fluorescent material layer 3 is arranged in a manner to cover the top surface of the substrate 2. The fluorescent material layer 3 has a wavelength conversion function of absorbing all or a part of incident light, and emitting light having a wavelength different from the wavelength of the incident light.

The fluorescent material layer 3 contains a plurality of the fluorescent material particles 31, and at least a part of the fluorescent material particles 31 is covered with the translucent material 32. The fluorescent material layer 3 has the voids 34 between the fluorescent material particles 31. Light entering the fluorescent material layer 3 is scattered by the voids 34, and efficiently absorbed by the fluorescent material particles 31 contained in the fluorescent material layer 3. Thus, compared to the case without the voids 34, a higher wavelength conversion efficiency can be achieved. In other words, the fluorescent material layer 3 can have a smaller thickness than the case without the voids 34 to achieve the same wavelength conversion efficiency.

The surface of the fluorescent material layer 3 has irregularities reflecting the particle diameters of the fluorescent material particles 31. The irregularities reduce total reflection on the surface of the fluorescent material layer 3 to achieve efficient extraction of light from the fluorescent material layer 3.

The fluorescent material layer 3 preferably has a thickness (the length in the direction in which light from a light source 50 travels and in the vertical direction of the fluorescent material layer 3 in FIG. 1) of 120 µm or less. This range enables easier extraction of light from the fluorescent material layer 3 in the thickness direction, achieving a desired brightness.

For the fluorescent material particles 31, any fluorescent material known in the art may be used. For example, those exemplified in Japanese Patent Application Publication No. 2013-203822 and Japanese Patent Application Publication No. 2014-135400 may be used. Specific examples include cerium-activated yttrium aluminum garnet (YAG) fluorescent materials; cerium-activated lutetium aluminum garnet (LAG) fluorescent materials; calcium-α fluorescent materials; europium-activated silicate ($(Sr,Ba)_2SiO_4$:Eu) fluorescent materials; oxynitride fluorescent materials, such as a sialon or β sialon oxynitride fluorescent materials; $(Ba,Sr,Ca)_2Si_5N_8$:Eu fluorescent materials; nitride fluorescent materials, such as CASN ($CaAlSiN_3$:Eu(Ce)) based or SCASN ($(Sr,Ca)AlSiN_3$:Eu(Ce)) based fluorescent materials; KSF fluorescent materials ($K_2SiF_6$:Mn), and sulfide fluorescent materials. Further, Group II-VI, III-V, and IV-VI semiconductors, specifically, CdSe, core-shell $CdS_xSe_{1-x}$/ZnS, nanocrystals, such as GaP, or a light-emitting substance called quantum dot may be used. These may be used alone or in combination of two or more. In particular, a material that absorbs blue light from ultraviolet light, and emits red light from blue light is preferable.

The fluorescent material particles 31 preferably have an average particle diameter of about 1 to 50 µm, and more preferably about 5 to 20 µm. The average particle diameter can be determined by Fisher Sub-Sieve Sizer (FSSS) method using, for example, Fisher Sub-Sieve Sizer Model 95 (by Fisher Scientific).

The fluorescent material particles 31 preferably have an average particle diameter of 1 to 50 µm, and 50% or more of the total mass of the fluorescent material particles 31 preferably has a particle diameter of 1 µm or more. Using such fluorescent material particles 31 allows relatively easy formation of the fluorescent material layer 3 having the voids 34.

The fluorescent material layer 3 may further contain, for example, an inorganic filler. Addition of an inorganic filler having, for example, a high refractive index allows light that has entered the fluorescent material layer 3 and has been converted by the fluorescent material to be scattered to promote mixing of light to eliminate color unevenness. Addition of an inorganic filler having a high thermal conductivity allows efficient transmission of heat generated by Stokes loss to the substrate 2, improving heat dissipation. Addition of an inorganic filler can also allow adjustment of, for example, the ratio or the shape of the voids 34 in the fluorescent material layer 3, as well as the shape of irregularities of the surface of the fluorescent material layer 3.

Examples of the inorganic filler having a high refractive index include oxides, such as $TiO_2$, $Ta_2Os$, $Nb_2Os$, and $ZrO_2$, SiC, and diamond. Examples of the inorganic filler having a high thermal conductivity include nitrides, such as AlN and GaN, SiC, and diamond. These may be used alone or in combination of two or more. The inorganic fillers may have about the same particle diameter as the fluorescent material particles 31.

Translucent Material 32

The translucent material 32 is filled in a part of the voids 34 between the fluorescent material particles 31. The translucent material 32 preferably has a high light transmittance. For example, an organic material containing silicone resin or epoxy resin, or $SiO_2$, $Al_2O_3$ or glass may be used. Of these, silicone resin is preferable.

When the wavelength conversion member is a light transmissive member, the ratio of the area of the translucent material 32 to the area of the fluorescent material particles 31 (the area of the translucent material 32/the area of the fluorescent material particles 31) is preferably from 1/17 to 5/4 in a cross-sectional view vertical to the top surface of the fluorescent material layer 3. This ratio can achieve both prevention of an excessive increase in the light-emitting size, and an improvement of light extraction efficiency in a well-balanced manner.

The material for the translucent material 32 is selected to satisfy the relationship n1>n2>n3 where n1 is the refractive index of the fluorescent material particles 31, n2 is the refractive index of the translucent material 32, and n3 is the refractive index of the voids 34. This configuration can reduce total reflection at the interfaces among the fluorescent material particles 31, the translucent material 32, and the voids 34, and allow efficient extraction of light in the direction toward the top surface of the fluorescent material layer 3. Although light can more easily be transmitted in the wavelength conversion member 10 containing an increased amount of the translucent material 32, light transmission can be reduced by the voids 34 according to the present embodiment. Thus, while preventing excessive increase in the light-emitting size, the light extraction efficiency can be improved.

Light Emitting Device 100

Figure 3:
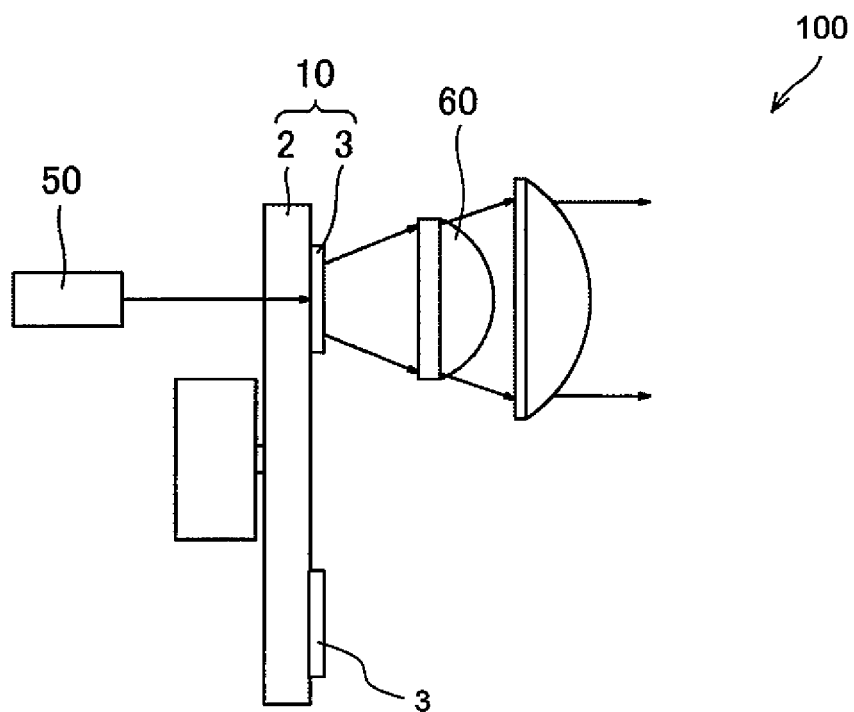
FIG. 3 is a schematic cross-sectional view of a light-emitting device according to an embodiment of the present disclosure.

Referring to FIG. 3, a light-emitting device 100 including the wavelength conversion member 10 will now be described. The light-emitting device 100 mainly includes a light source 50, and the wavelength conversion member 10. The light-emitting device 100 causes light emitted by the light source 50 to enter the wavelength conversion member 10, converts the wavelength of light with the wavelength conversion member 10, and emits light having a different wavelength from the incident light. The wavelength conversion member 10 shown in FIG. 3 includes the substrate 2 having a disk shape, and a rotating shaft at its center. The wavelength conversion member 10 is configured to rotate about the rotating shaft so that the position receiving light from the light source 50 moves with time. In FIG. 3, the fluorescent material layer 3 is arranged on the circumference of the rotating shaft of the light transmissive substrate 2.

Light Source 50

The light-emitting device 100 includes a semiconductor laser element as the excitation light source 50. A semiconductor laser element typically has a narrow angle of light radiation. Thus, the wavelength conversion member can have a small area for receiving light radiation. The light emitted from the semiconductor laser element can have a main wavelength within a range of, for example, from 400 nm to 480 nm. The semiconductor laser element may include a single semiconductor laser element or multiple semiconductor laser elements.

Lens 60

The light-emitting device 100 includes a lens 60 for controlling light from the wavelength conversion member 10. The lens 60 is a member for controlling the orientation of light from the semiconductor laser element and light from the fluorescent material particles 31. Light emitted from the wavelength conversion member 10 spreads at a constant angle, and thus the lens 60 is preferably arranged at a position near the wavelength conversion member 10 for easier collection of light. This configuration allows the lens 60 to collect light when the angle of spread of light is still small. This can downsize the lens 60, and can downsize the light-emitting device 100 and reduce the cost therefor. The lens 60 may include a single lens or multiple lenses.

The material for the lens 60 may be, for example, resin or glass. When light with short wavelengths, such as light with a wavelength of 400 to 480 nm, is used as the light source 50 of the present invention, a glass lens is preferably used because glass has a higher resistance to light with a short wavelength. For the lens 60, various lenses, such as a collimated lens, a condensing lens, or a rod lens, may be used.

Filter

To further efficiently extract light, a filter appropriate for the application purpose may be arranged on the top surface or the lower surface of the fluorescent material layer 3. Examples of the filter include a short pass filter, which transmits light with a shorter wavelength than a predetermined wavelength and reflects light with a longer wavelength, a long pass filter, which transmits light with a longer wavelength than a predetermined wavelength and reflects light with a shorter wavelength, a band pass filter, which transmits only light within a specific wavelength range, and a reflectionless filter.

Figure 4:
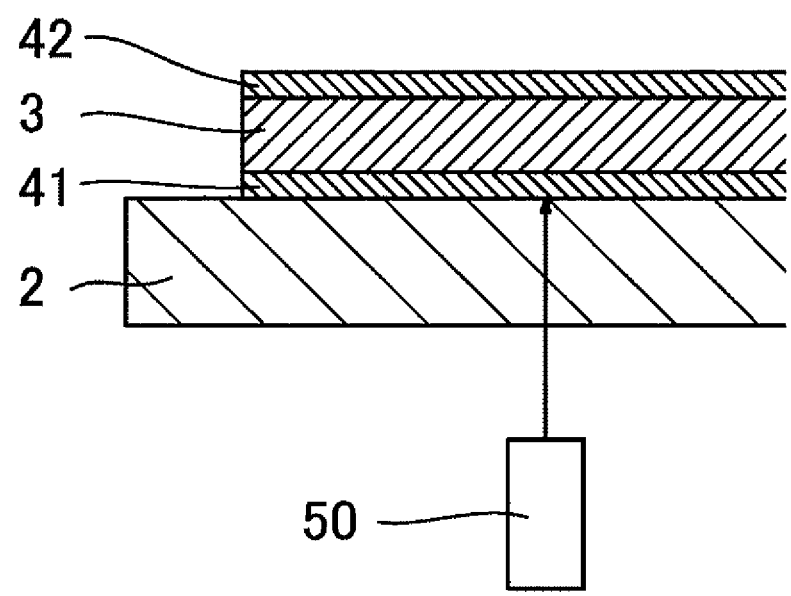
FIG. 4 is a schematic cross-sectional view of an exemplary filter arrangement.

FIG. 4 is a schematic cross-sectional view of an exemplary filter arrangement. A short pass filter may be arranged between the light source 50 and the fluorescent material layer 3 as a first filter 41. The first filter 41 transmits light from the light source 50 and reflects light from the fluorescent material layer 3. This allows extraction of light upward with no waste of even light moving downward.

A long pass filter may be arranged between the fluorescent material layer 3 and the lens 60 as a second filter 42 that reflects light from the light source 50, and transmits light from the fluorescent material layer 3. This allows light not yet wavelength-converted to be reflected to the fluorescent material layer 3 and to be excited. In particular, arranging the second filter 42 in combination with the first filter 41 allows such reflected and excited light to be reflected again by the first filter 41, increasing wavelength-converted light.

As the second filter 42, a band pass filter, which transmits only light within a specific range, can be provided between the fluorescent material layer 3 and the lens 60. In other words, a filter that reflects light having either short waves or long waves may be provided instead of a filter that reflects light having a wavelength within a necessary range. This enables control of the wavelength width of light to be emitted, achieving emission of desired light.

A transparent layer may be provided between the second filter 42 and the fluorescent material layer 3. A transparent layer can flatten the top surface of the fluorescent material layer 3 to enhance the effect of the second filter 42.

Projector 200

Figure 5:
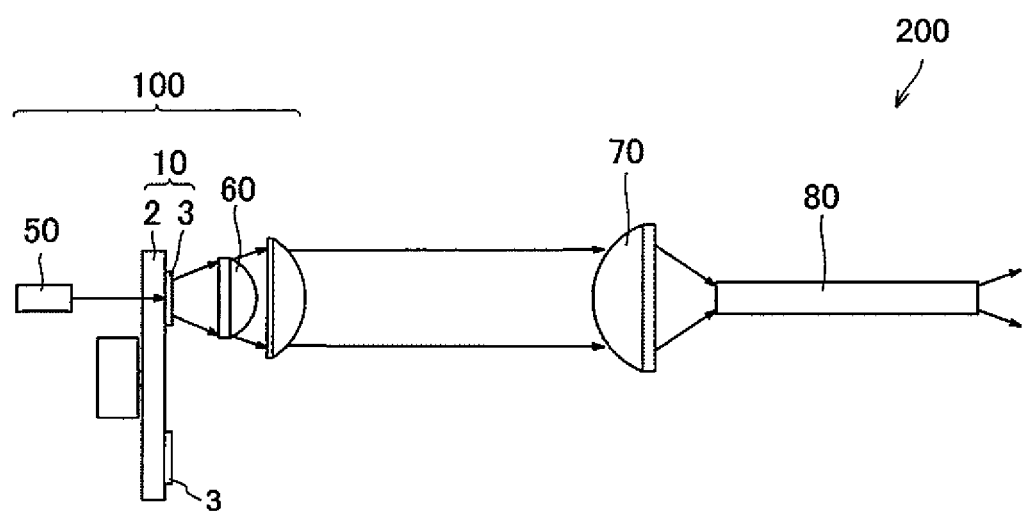
FIG. 5 is a schematic view of the structure of a projector including a light-emitting device according to an embodiment of the present disclosure.

Referring to FIG. 5, a projector 200 including the light-emitting device 100 will now be described. The projector 200 mainly includes the light-emitting device 100, a lens 70, and a multiplexing optical component 80.

The lens 70 is a condensing lens for collecting light emitted by the light-emitting device 100. The lens 70 may include a single lens or multiple lenses. The lens 70 is arranged on the light incident side of the multiplexing optical component 80. Light collected by the lens 70 is emitted on the incidence plane of the multiplexing optical component 80. The multiplexing optical component 80 multiplexes light collected by the lens 70. The multiplexing optical component 80 includes, for example, a rod integrator or a light pipe.

The projector 200 can further include a light modulator or a projection lens. The light modulator modulates light that has been multiplexed by the multiplexing optical component 80. The light modulator includes, for example, a digital micromirror device (DMD) and a crystal element. The projection lens projects light that has been modulated by the light modulator on a screen (not shown).

EXAMPLES

Examples according to the present invention will now be described in detail.

Example 1

FIG. 1 is a schematic cross-sectional view of a wavelength conversion member 10 produced by the production method according to Example 1. As the volatile member, a vehicle including an organic solvent and resin was used. To the volatile member, a small amount of boracic acid based or alumina based binder was added. A mixture of 10 g of the volatile member as a binder and 20 g of a YAG fluorescent material having an average particle diameter of 10 μm was applied on a glass substrate 2 using a screen printer to form a fluorescent material layer 3 having a film thickness of about 70 μm. The volatile member was allowed to volatilize to form the fluorescent material layer 3. The thus formed fluorescent material layer 3 has relatively many voids near the substrate 2.

To the fluorescent material layer 3, a translucent material 32 containing phenyl silicone resin was applied by spraying with a spray. The amount of application of the translucent material 32 was adjusted to allow the translucent member to have a film thickness of about 10 μm when formed in the form of a plate. The translucent material 32 was then cured by heating at 180° C. for 5 hours to form the filled region 33.

The resultant wavelength conversion member 10 was used as a color wheel of a projector, and while rotating the color wheel at 7200 rpm, the wavelength conversion member 10 was irradiated with light from a blue semiconductor laser element (wavelength: 445 nm, making current: 1 mA) to emit light. The emission image of the wavelength conversion member was analyzed. When the number of pixels corresponding to $1/e^2$ or more of the peak intensity in the light intensity distribution is defined as the light-emitting size, the size was 132.

Further, using the wavelength conversion member 10 of Example 1 as the wavelength conversion member 10 of the projector 200 and a blue semiconductor laser element (wavelength: 445 nm, output: 72 W) as the light source 50 in FIG. 5, the output of the projector was measured. The output of the projector including the wavelength conversion member of Example 1 was 106.9% when the output of the projector including the wavelength conversion member of Comparative Example 1 described later was taken as 100%.

Example 2

Example 2 differs from Example 1 in that the amount of application of the translucent material 32 was adjusted to allow the translucent member to be formed to have a film thickness of 23 μm when formed in the form of a plate. The thus formed fluorescent material layer 3 also has more voids near the substrate 2 although less than the ratio in Example 1. The resultant wavelength conversion member had a light-emitting size of 143. The projector including the wavelength conversion member of Example 2 had an output of 106.3% relative to the output of the projector including the wavelength conversion member of Comparative Example 1.

Example 3

Example 3 differs from Example 1 in that the amount of application of the translucent material 32 was adjusted to allow the translucent member to be formed to have a film thickness of 29 μm when formed in the form of a plate. The thus formed fluorescent material layer 3 also has more voids near the substrate 2 although less than the ratio in Example 1. The resultant wavelength conversion member had a light-emitting size of 146. The projector including the wavelength conversion member of Example 3 had an output of 106.0% relative to the output of the projector including the wavelength conversion member of Comparative Example 1.

Comparative Example 1

As Comparative Example 1, a wavelength conversion member was formed in the same manner as Example 1 except that the filled region 33 was not formed. The resultant wavelength conversion member had a light-emitting size of 128.

Comparative Example 2

As Comparative Example 2, a wavelength conversion member was formed in the same manner as Example 1 except that a mixture of resin and a fluorescent material having essentially no voids, instead of the fluorescent material layer 3 with voids, was used to form a wavelength conversion member. Specifically, the wavelength conversion member was formed in the procedure described below. A mixture of 10 g of silicone resin as a binder and 20 g of YAG fluorescent material particles with a particle diameter of 10 μm was applied on a glass substrate 2 with a screen printer. The silicone resin was cured by heating at 180° C. for 5 hours. The resultant fluorescent material layer 3 had an average thickness of 110 μm. The resultant wavelength conversion member had a light-emitting size of 153. The projector including the wavelength conversion member of Comparative Example 2 had an output of 96.6% relative to the output of the projector including the wavelength conversion member of Comparative Example 1.

Table 1 shows the relationships between the light-emitting size and the output of the respective projectors including the wavelength conversion members of Examples and Comparative Examples.

TABLE 1

| | Fluorescent material layer | | | Translucent material Target | Light-emitting size | Relative |
|---|---|---|---|---|---|---|
| | Fluorescent material | Binder | Thickness (μm) | thickness (μm) | (Number of pixels) | output (%) |
| Example 1 | YAG | Volatile member | 70 | 10 | 132 | 106.9 |
| Example 2 | YAG | Volatile member | 70 | 23 | 143 | 106.3 |
| Example 3 | YAG | Volatile member | 70 | 29 | 146 | 106.0 |
| Comparative Example 1 | YAG | Volatile member | 70 | — | 128 | 100 |
| Comparative Example 2 | YAG | Silicone resin | 110 | — | 153 | 96.6 |

As shown in Table 1, all the projectors including the wavelength conversion members of Examples 1 to 3 show improved output compared to the projector including the wavelength conversion member of Comparative Example 1, which has no filled region 33. Also, all the Examples 1 to 3 show a smaller light-emitting size than Comparative Example 2 where the fluorescent material layer 3 includes a mixture of a fluorescent material and resin with essentially no voids. Examples 1 to 3 are understood to control both the output and the light-emitting size.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of producing a wavelength conversion member, the method comprising:
    forming a fluorescent material layer containing a plurality of fluorescent material particles and having voids between the plurality of fluorescent material particles on a top surface of a substrate; and
    impregnating the fluorescent material layer with a translucent material that has been applied on a surface of the fluorescent material layer so as to leave a part of the voids, wherein the translucent material has a lower refractive index than the fluorescent material particles,
    wherein the translucent material is applied on the surface of the fluorescent material layer by spraying, potting, or inkjet-printing.

2. The method of producing a wavelength conversion member according to claim 1, wherein the fluorescent material layer after the impregnating has a higher void ratio near a lower surface of the fluorescent material layer than near a top surface of the fluorescent material layer.

3. The method of producing a wavelength conversion member according to claim 2, wherein in the wavelength conversion member, a ratio of an area of the translucent material to an area of the fluorescent material particles is from 1/17 to 5/4 in a cross-sectional view vertical to the top surface of the fluorescent material.

4. The method of producing a wavelength conversion member according to claim 2, wherein a mixture of the fluorescent material particles and a volatile member is applied on the top surface of the substrate, and then at least a part of the volatile member is volatilized to form the fluorescent material layer on the top surface of the substrate in forming the fluorescent material layer.

5. The method of producing a wavelength conversion member according to claim 2, wherein the translucent material includes silicone resin.

6. The method of producing a wavelength conversion member according to claim 1, wherein in the wavelength conversion member, a ratio of an area of the translucent material to an area of the fluorescent material particles is from 1/17 to 5/4 in a cross-sectional view vertical to a top surface of the fluorescent material layer.

7. The method of producing a wavelength conversion member according to claim 6, wherein a mixture of the fluorescent material particles and a volatile member is applied on the top surface of the substrate, and then at least a part of the volatile member is volatilized to form the fluorescent material layer on the top surface of the substrate in forming the fluorescent material layer.

8. The method of producing a wavelength conversion member according to claim 6, wherein the translucent material includes silicone resin.

9. The method of producing a wavelength conversion member according to claim 1, wherein a mixture of the fluorescent material particles and a volatile member is applied on the top surface of the substrate, and then at least a part of the volatile member is volatilized to form the fluorescent material layer on the top surface of the substrate in forming the fluorescent material layer.

10. The method of producing a wavelength conversion member according to claim 9, wherein the translucent material includes silicone resin.

11. The method of producing a wavelength conversion member according to claim 1, wherein the translucent material includes silicone resin.

12. The method of producing a wavelength conversion member according to claim 1, wherein the impregnating is carried out in such a manner that the translucent material is not on at least a portion of the top surface of the substrate.

13. The method of producing a wavelength conversion member according to claim 12, wherein the impregnating is carried out in such a manner that at least a part of the portion of the top surface of the substrate that the translucent material is not on is surrounded by the translucent material or the fluorescent material particles.

14. The method of producing a wavelength conversion member according to claim 12, wherein the impregnating is carried out in such a manner that the portion of the top surface of the substrate that the translucent material is not on is located within an outer boundary of the fluorescent material layer.

15. The method of producing a wavelength conversion member according to claim 1, wherein at least part of the voids existing between the fluorescent material particles are formed in contact with the top surface of the substrate.

16. The method of producing a wavelength conversion member according to claim 1, wherein a void surrounded by the translucent material or the fluorescent material particles is formed on a part of the top surface of the substrate.

17. A method of producing a wavelength conversion member, the method comprising:
    forming a fluorescent material layer containing a plurality of fluorescent material particles and having voids between the plurality of fluorescent material particles on a top surface of a substrate; and
    impregnating the fluorescent material layer with a translucent material that has been applied on a surface of the fluorescent material layer so as to leave a part of the voids, wherein the translucent material has a lower refractive index than the fluorescent material particles,
    wherein a mixture of the fluorescent material particles and a volatile member is applied on the top surface of the substrate, and then at least a part of the volatile member is volatilized to form the fluorescent material layer on the top surface of the substrate in forming the fluorescent material layer, and
    wherein the method further comprises preparing the volatile member by dissolving a resin in an organic solvent.

18. The method of producing a wavelength conversion member according to claim 17, wherein the fluorescent material layer after the impregnating has a higher void ratio near a lower surface of the fluorescent material layer than near a top surface of the fluorescent material layer.

19. The method of producing a wavelength conversion member according to claim 17, wherein in the wavelength conversion member, a ratio of an area of the translucent material to an area of the fluorescent material particles is from 1/17 to 5/4 in a cross-sectional view vertical to a top surface of the fluorescent material layer.

* * * * *